(12) United States Patent
Konvisser et al.

(10) Patent No.: US 9,693,452 B2
(45) Date of Patent: Jun. 27, 2017

(54) APPARATUS COMPRISING A CONDUCTIVE PATH AND A METHOD OF FORMING AN APPARATUS WITH A CONDUCTIVE PATH

(75) Inventors: Aaron B. Konvisser, San Diego, CA (US); Mohammad Ali Mockarram-Dorri, San Diego, CA (US); Pasi Laine, Lempaala (FI)

(73) Assignee: Nokia Technologies Oy, Espoo (FI)

( * ) Notice: Subject to any disclaimer, the term of this patent is extended or adjusted under 35 U.S.C. 154(b) by 89 days.

(21) Appl. No.: 13/536,201

(22) Filed: Jun. 28, 2012

(65) Prior Publication Data

US 2014/0002370 A1    Jan. 2, 2014

(51) Int. Cl.
| | | |
|---|---|---|
| *G06F 3/041* | (2006.01) | |
| *H05K 1/09* | (2006.01) | |
| *H05K 1/02* | (2006.01) | |
| *G06F 1/16* | (2006.01) | |
| *H04M 1/02* | (2006.01) | |

(52) U.S. Cl.
CPC .............. *H05K 1/09* (2013.01); *G06F 1/1626* (2013.01); *G06F 1/1656* (2013.01); *H05K 1/028* (2013.01); *G06F 3/041* (2013.01); *G06F 2203/04102* (2013.01); *G06F 2203/04103* (2013.01); *H04M 1/0202* (2013.01); *H04M 2250/22* (2013.01); *H05K 2201/0326* (2013.01); *H05K 2201/0391* (2013.01); *H05K 2201/0979* (2013.01); *Y10T 29/4913* (2015.01)

(58) Field of Classification Search
CPC ...... G06F 3/041; G06F 3/0412; G06F 3/0416; G06F 3/047; G06F 2203/04102; G06F 3/044; G06F 3/0414; G06F 2203/04103; G06F 2203/04111; G06F 2203/04112; G02F 1/13338; H05K 1/0277; H05K 1/0278; H05K 1/028; H05K 1/0296; H05K 1/0393; H05K 1/09; H05K 1/092; H05K 1/11; H05K 1/118; H05K 1/147; G09G 2300/0421; G09G 2300/0426; G09G 2380/02
USPC .................. 345/173, 174; 178/18.01, 18.03, 178/18.05–18.07
See application file for complete search history.

(56) References Cited

U.S. PATENT DOCUMENTS

| | | | | |
|---|---|---|---|---|
| 5,408,052 | A * | 4/1995 | Inaba et al. ................... | 174/261 |
| 5,516,989 | A * | 5/1996 | Uedo et al. ................... | 174/254 |
| 7,629,538 | B2 * | 12/2009 | Heisen et al. ................ | 174/254 |
| 8,416,208 | B2 * | 4/2013 | Kim ..................... | G06F 1/1626 |
| | | | | 345/173 |
| 8,917,250 | B2 * | 12/2014 | Kim et al. .................... | 345/173 |
| 2004/0266502 | A1* | 12/2004 | Holtorf et al. ............... | 455/899 |
| 2008/0236905 | A1* | 10/2008 | Endo et al. ................. | 178/18.03 |
| 2010/0242274 | A1* | 9/2010 | Rosenfeld ........... | G06F 3/03543 |
| | | | | 29/848 |
| 2012/0162099 | A1* | 6/2012 | Yoo et al. ..................... | 345/173 |
| 2012/0218219 | A1* | 8/2012 | Rappoport .......... | H01L 27/3276 |
| | | | | 345/174 |
| 2013/0229379 | A1* | 9/2013 | Joguet .................... | G06F 3/045 |
| | | | | 345/173 |

* cited by examiner

*Primary Examiner* — Jason Mandeville

(74) *Attorney, Agent, or Firm* — Harrington & Smith

(57) ABSTRACT

An apparatus including a substrate; at least one conductive path extending over the substrate and including a first portion of indium tin oxide connected in electrical series to a second portion of a different conductor.

18 Claims, 4 Drawing Sheets

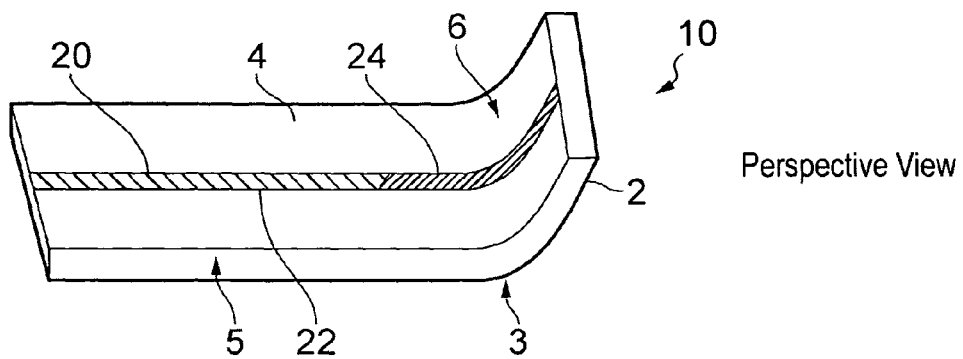
FIG. 1A  Perspective View
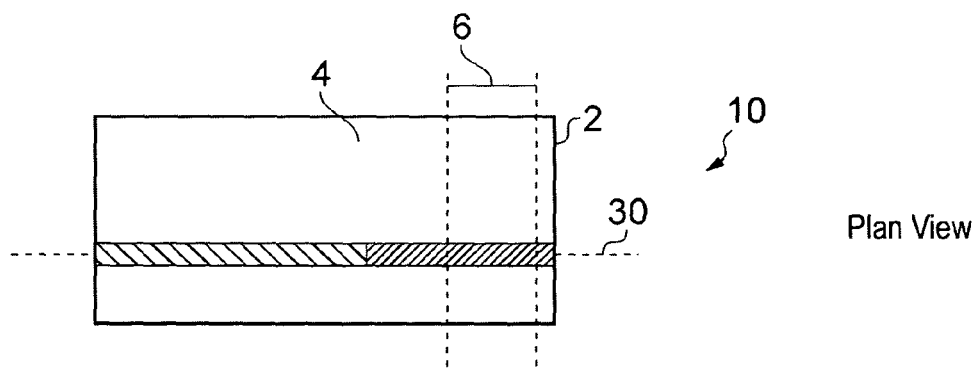
FIG. 1B  Plan View
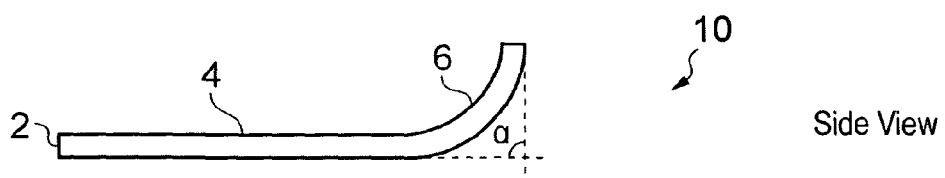
FIG. 1C  Side View
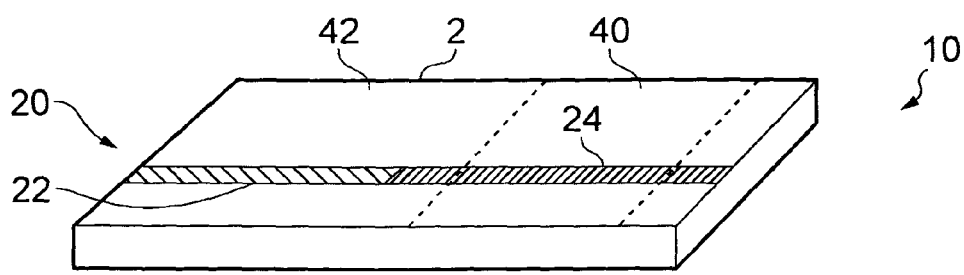
FIG. 2

APPARATUS COMPRISING A CONDUCTIVE PATH AND A METHOD OF FORMING AN APPARATUS WITH A CONDUCTIVE PATH

TECHNOLOGICAL FIELD

Embodiments of the present invention relate to an apparatus comprising a conductive path and a method of forming an apparatus with a conductive path.

BACKGROUND

A conductive path is often used in an apparatus to convey electrical energy from one area to another area. This may be, for example, useful for transmitting data or signals or transferring electrical power.

BRIEF SUMMARY

According to various, but not necessarily all, embodiments of the invention there is provided an apparatus comprising: a substrate comprising a first portion and a different second portion; and at least one conductive path extending over the substrate and comprising a first portion of non-bendable conductor connected in electrical series to a second portion of a different conductor, wherein the first portion of the conductive path extends over the first portion of the substrate and the second portion of the conductive path extends over the second portion of the substrate to form a line following a surface of the substrate.

According to various, but not necessarily all, embodiments of the invention there is provided a method comprising: providing a non-bendable conductor on a first portion of a substrate as a first portion of a conductive path extending over the substrate; and providing a different conductor on a second portion of the substrate as a second portion of the conductive path extending over the substrate; wherein the first portion of indium tin oxide and the second portion of a different conductor are connected in electrical series to form the conductive path extending over the substrate to form a line following a surface of the substrate.

According to various, but not necessarily all, embodiments of the invention there is provided an apparatus comprising: a substrate; and at least one conductive path extending over the substrate and comprising a first portion of a first conductor connected in electrical series to a second portion of a second different conductor, wherein the first conductor has a higher probability of damage when bent than the second conductor.

According to various, but not necessarily all, embodiments of the invention there is provided an apparatus comprising: a substrate; and at least one conductive path extending over the substrate and comprising a first portion of indium tin oxide connected in electrical series to a second portion of a different conductor.

The apparatus therefore is able to utilize advantages conveyed by a desired non-bendable conductor without being constrained by its non-bendable properties. Where the non-bendable properties of the conductor are a constraint such as where the substrate curves or can bend, a different conductor may be used in the conductive path.

BRIEF DESCRIPTION

For a better understanding of various examples of embodiments of the present invention reference will now be made by way of example only to the accompanying drawings in which:

FIG. 1A is a perspective elevated side view of an example of an apparatus comprising a substrate and one or more conductive paths;

FIG. 1B is a top plan view of the apparatus illustrated in FIG. 1A;

FIG. 1C is a side view of the apparatus illustrated in FIG. 1A;

FIG. 2 is a perspective elevated side view of a different example of an apparatus comprising a substrate and one or more conductive paths;

DETAILED DESCRIPTION

Figure 3:
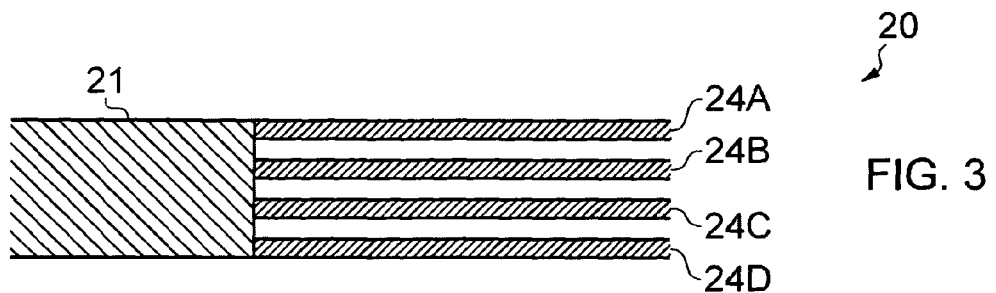
FIG. 3 illustrates one of many possible different examples of a second flexible portion of a conductive path.

The Figures illustrate an apparatus 10 comprising: a substrate 2 comprising a first portion 5, 42 and a different second portion 3, 40; and at least one conductive path 20 extending over the substrate 2 and comprising a first portion 22 of non-bendable conductor connected in electrical series to a second portion 24 of a different conductor, wherein the first portion 22 of the conductive path 20 extends over the first portion 5, 42 of the substrate 2 and the second portion 24 of the conductive path 20 extends over the second portion 3, 40 of the substrate 2 to form a line following a surface 4 of the substrate 2.

In some but not necessarily all embodiments, the non-bendable conductor is indium tin oxide.

FIGS. 1A, 1B and 1C illustrates an example of an apparatus 10 that provides one or more conductive paths 20 that extend over a permanently curved substrate 2. FIG. 1A is a perspective elevated side view of the apparatus 10, FIG. 1B is a top plan view of the apparatus 10 and FIG. 1C is a side view of the apparatus 10.

In the illustrated example, one conductive path 20 is shown. However, in other embodiments multiple conductive paths 20 may be provided. Such multiple conductive paths 20 may be overlapping or non-overlapping, such as the parallel conductive paths 20 illustrated in FIG. 4.

Figure 5:
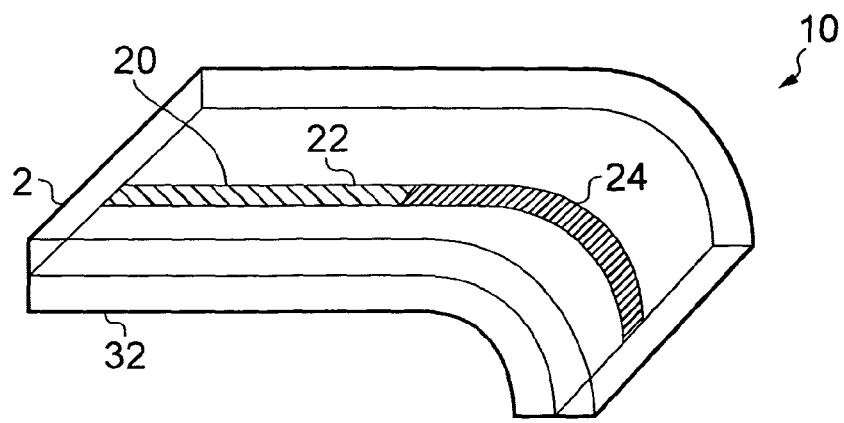
FIG. 5 illustrates an example of an apparatus that in addition to the substrate and the one or more conductive paths comprises a flexible film.

The apparatus 10 comprises a substrate 2. The substrate 2 is a body that comprises a surface 4 over which the one or more conductive paths 20 extend. The term 'extend-over' is intended to imply that a conductive path 20 and the substrate 2 overlap along at least a portion of the conductive path 20. The conductive path 20 may extend over the substrate 2 and be positioned either above the substrate (FIGS. 1A-1C and FIG. 2) or be positioned underneath the substrate 2 (FIG. 5).

In some but not necessarily all embodiments, the substrate 2 may be transparent. For example, in some but not necessarily all embodiments the the substrate is a display screen.

In some but not necessarily all embodiments, the substrate 2 may be formed from glass or plastic. An example of a suitable plastic is Polyethylene terephthalate (PET).

The conductive path(s) 20 that extend over the substrate 20 comprise a first portion 22 of indium tin oxide connected in electrical series to a second portion 24 of a different conductor.

In the illustrated example, the first portion 22 of indium tin oxide is directly connected in electrical series to the second portion 24 of a different conductor through a direct electrical connection where they meet.

The indium tin oxide is conductive. The indium tin oxide may be applied such that is a transparent thin film. However, the indium tin oxide may be brittle and may break when subjected to strain or bending.

The different conductor is a flexible conductor. It is more flexible than indium tin oxide and is less likely to break when subjected to strain or bending.

The different conductor may be malleable and/or ductile.

The different conductor may comprise or be formed from a metal such as, for example, copper, silver or gold.

Referring to FIG. 1A, the substrate 2 is curved. The substrate 2 comprises a curved portion 3 that defines an interior surface 4 that has a curvature 6. The second portion 24 is located at the curved portion 3 and follows the curvature 6 of the surface 4. The second portion 24 of the different conductor may therefore be under compressive strain. Indium tin oxide is not located at the curved portion. For example, the first portion 22 is located only at a flat portion 5 of the substrate 2.

The first portion 22 of indium tin oxide and the second portion 24 of the different conductor that form the conductive path 20 extend in a straight line 30 following the surface 4 of the substrate 2. That is, in this example, the conductive path 20 deviates from the course of a flat, straight line because it follows the curvature 6 of the surface 4 of the substrate 2 but not otherwise.

FIG. 1C illustrates the curvature 6 of the surface 4 of the substrate 2. In this example the curvature 6 is obtuse. The curvature 6 has a gradient that is monotonically changing. The curvature 6 may be considered to have a start position where the gradient starts to change in a first sense and an end position where the gradient stops changing in that first sense. The angle between a tangent at the start position and a tangent at the end position define an angle α, which in this example is obtuse being greater than 90° and less than 180°.

In some embodiments, the substrate 2 may have an exterior surface that is exposed in use and is subject to potential damage in use and an internal surface that is not exposed in use. The conductive path 20 may be positioned on the interior surface 4.

FIG. 2 is a perspective elevated side view of a different embodiment of the apparatus 10. In this example, the substrate 10 is not curved but it is bendable such that it can permanently or temporarily be similar to the apparatus 10 illustrated in FIGS. 1A, 1B and 1C.

The second portion 24 of the different conductor is positioned where it is likely to be subjected to strain.

In this example, the substrate 2 comprises a bendable portion 40 and a rigid portion 42. The second portion 22 of the different conductor extends over the bendable portion 40 of the substrate 2. Indium tin oxide is not located at the bendable portion. It is located at the rigid portion 42 only. For example, the first portion 22 is located only at a rigid flat portion 5 of the substrate 2.

FIG. 3 illustrates one of many possible different examples of the second portion 24 in close up. In this example, the conductive path 20 comprises multiple portions 24A, 24B, 24C, 24D . . . of the different conductor connected in parallel. In some embodiments, each of the multiple portions 24A, 24B, 24C, 24D may have a width less than 0.1 mm (100 μm) and a separation greater than 0.1 mm (100 μm). Each of the multiple portions 24A, 24B, 24C, 24D may be formed from a conductor that is different to indium tin oxide but they may each be formed from the same conductive material or from different conductive material.

The multiple portions 24A, 24B, 24C, 24D may be flexible conductors. They are more flexible than indium tin oxide. They may be formed from a conductive material that is malleable and/or ductile. The multiple portions 24A, 24B, 24C, 24D may comprise or be formed from a metal or metals such as, for example, copper, silver or gold.

Figure 4:
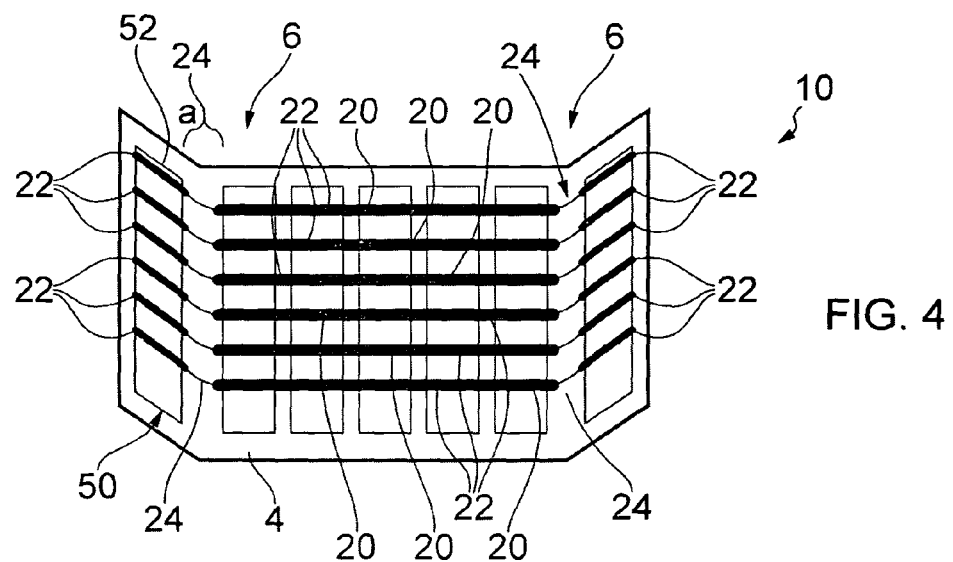
FIG. 4 illustrates an example of an apparatus in which the substrate forms a curved transparent display.

Other different examples of the second portion 24 may, for example, include multiple conductors arranged in a mesh pattern or an overlapping pattern. FIG. 4 illustrates an example of an apparatus 10 in which the substrate 2 forms a curved transparent display.

Touch detection circuitry 52 extends over the interior surface 4 of the substrate 2. The touch detection circuitry 52 comprises multiple conductive paths 20 extending in parallel over the interior surface 4 of the substrate 2.

The touch detection circuitry 52 also comprises separate traces 50 of indium tin oxide that extend parallel to each other and orthogonal to the conductive paths 20.

The multiple conductive paths 20 each comprise a first portion 22 of indium tin oxide connected in electrical series to a second portion 24 of a different conductor as previously described.

In the illustrated example each of the multiple conductive paths 20 crosses a first curvature 6 of the substrate 2 and a second curvature 6' of the substrate 2. The first and second curvatures 6, 6' oppose each other. Each of the conductive paths 20 follows the surface of the substrate 2 in a straight line. Each of the conductive paths 20 comprises a first portion 22 of indium tin oxide connected in electrical series to a second portion 24 of a different conductor that overlaps the curvature 6 and in electrical series to another second portion 24 of a different conductor that overlaps the curvature 6'. The first portion 22 of indium tin oxide does not overlap the curvatures 6, 6' in this example.

The apparatus 10 may be a housing cover for a hand-portable electronic device.

FIG. 5 illustrates an apparatus 10 that in addition to the substrate 2 and the one or more conductive paths comprises a flexible film 32.

The one or more conductive paths 20 extending over the substrate 2 is positioned between the flexible film 32 and the substrate 2. The flexible film 32 may be transparent.

Figure 8:
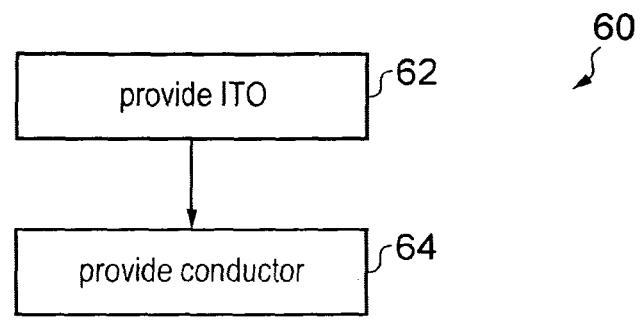
FIG. 8 illustrates a method of manufacturing an apparatus comprising a substrate and one or more conductive paths.

FIG. 8 illustrates a method of manufacturing any one of the previously described apparatus 10. The method 60 comprises at block 62 providing a first portion 22 of indium tin oxide on a substrate 2. Then at block 64 providing a second portion 24 of a different conductor on the substrate 2, where the first portion 22 of indium tin oxide and the second portion 24 of a different conductor are connected in electrical series to form a conductive path 20 extending over the substrate 2.

Figure 6:
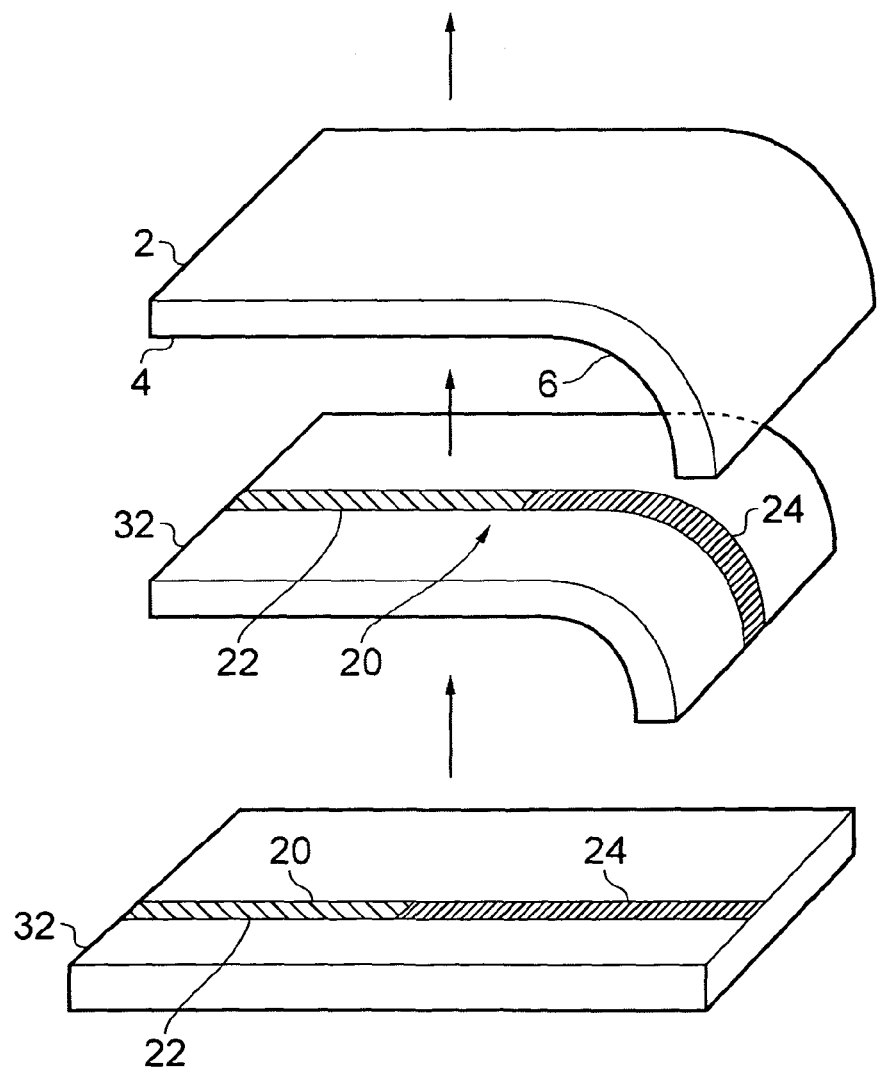
FIG. 6 illustrates a method of manufacturing an apparatus comprising a substrate, one or more conductive paths and a flexible film.

FIG. 6 illustrates a method of manufacturing the apparatus 10 illustrated in FIG. 5. It illustrates in more detail, actions that may occur at blocks 62, 64 of method 60.

FIG. 6 illustrates that the one or more conductive paths 20 extend initially over a flexible substrate 32. As described above the conductive paths 20 comprise at least a first portion of indium tin oxide 22 connected in electrical series to at least a second portion 24 of a different conductor.

As used here the terms 'first' and 'second' are convenient handles to indicate distinct portions. They do not necessarily imply an order of manufacture.

For each conductive path 20, at least one first portion 22 of indium tin oxide is provided on the film 32 and at least one second portion 24 of the different conductor on the film 32. The film 32 is then laminated to the interior surface 4 of the curved substrate 2. The conductive paths 20 is positioned between an interior layer of the laminate (the film 32) and an exterior layer of the laminate (the substrate 2). Thus the conductive path 20 extends over the substrate 2.

The positioning of the film 32 relative to the substrate 2 is such that the second portion 24 of the conductive path 20 overlaps the curvature 6 in the substrate 2. The flexible film 32 and the flexible second portion 24 conform to the curved interior surface 4 of the substrate 2.

The second portion 24 of the different conductor may be provided on the curved interior surface 4 of the substrate 2 such that it continues the straight line of the conductive path 20 while following the curve 6 of the substrate 2.

The substrate 2 may, for example, be transparent. It may, for example, be a display screen or a display cover. The substrate 2 may, for example, comprise glass or plastic The flexible film 32 may, for example, be transparent.

Figure 7A:
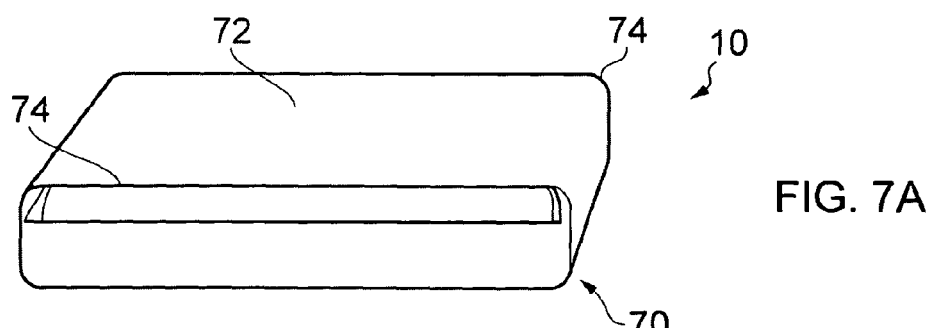
FIG. 7A, is a perspective elevated side view of an electronic device comprising the apparatus.
Figure 7B:
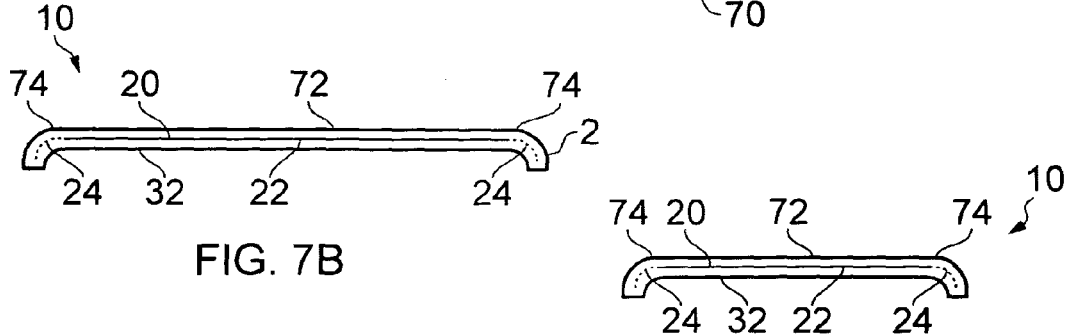
FIG. 7B is lengthwise cross-sectional view of FIG. 7A.
Figure 7C:
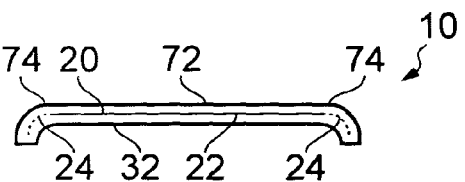
FIG. 7C is a width wise cross-sectional view of FIG. 7A.

FIG. 7A, is a perspective elevated side view of an electronic device 70 comprising the apparatus 10 previously described with reference to FIG. 5, however, other described apparatus 10 may be used instead. FIG. 7B is a lengthwise cross-sectional view. FIG. 7C is a width-wise cross-sectional view.

As illustrated in FIGS. 7A, 7B and 7C, the apparatus 10 may, for example, be a housing cover for a hand-portable electronic device 70. In this example, the substrate 2 comprises a transparent flat central portion 72 and a circumscribing curved portion 74. The conductive path 20 is formed from flexible conductors at the curved portion and is formed from transparent indium tin oxide at the flat central portion.

As used here 'module' refers to a unit or apparatus that excludes certain parts/components that would be added by an end manufacturer or a user. The apparatus 10 may be a module.

As used here the terms 'first' and 'second' indicate distinct elements, for example, portions. They do not necessarily imply an order in time, for example, an order of manufacture.

Figure 9A:
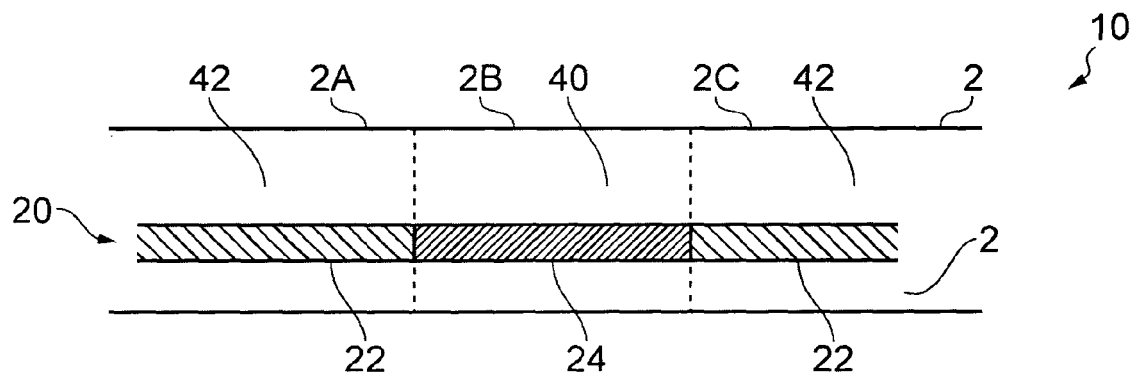
FIG. 9A is a perspective side view of an example of an apparatus comprising a substrate and one or more conductive paths.
Figure 9B:
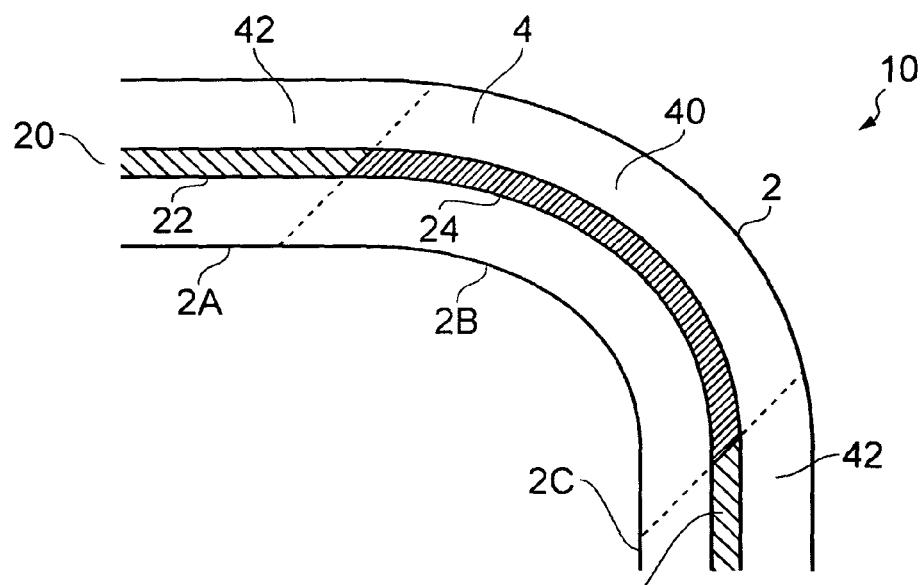
FIG. 9B is a perspective side view of an example of an apparatus comprising a substrate and one or more conductive paths.

FIGS. 9A and 9B illustrate examples where the substrate 2 of the apparatus 10 comprises a first portion 2A, a second portion 2B and a third portion 2C and the at least one conductive path 20 extending over the substrate comprises, in addition to the first portion 22 of the conductive path 20 and the second portion 24 of the conductive path 20, a third portion 22' of non-bendable conductor connected in electrical series to the second portion 24 of the conductive path 20.

The second portion 2B of the substrate 2 lies between the first portion 2A and the third portion 2C.

The second portion 24 of the conductive path 20 lies between the first portion 22 and the third portion 22'.

The first portion 22 of the conductive path 20 extends over the first portion 2A of the substrate 2 and the second portion 24 of the conductive path 20 extends over the second portion 2B of the substrate 2 as previously described. In FIG. 9A, the first portion 2A of the substrate 2 corresponds to the rigid portion 42 in FIG. 2 and the second portion 2B of the substrate 2 corresponds to bendable portion 40 in FIG. 2. In FIG. 9B, the first portion 2A of the substrate 2 corresponds to the flat portion 5 in FIG. 1 and the second portion 2B of the substrate 2 corresponds to curved portion 3 in FIG. 1. In the examples of FIGS. 9A and 9B, there is a third portion 22' of the conductive path 20 and it extends over the third portion 2C of the substrate 2.

The third portion 2C of the substrate is the same as the first portion 2A of the substrate 2 except for it location, that is. it is rigid in FIG. 9A and flat in FIG. 9B.

The third portion 22' of the conductive path 20 is the same as the first portion 22 of the conductive path 22 except for its location, that is, it extends the line of the conductive path 20 and is formed from non-bendable conductor.

In embodiments where indium tin oxide is used, the apparatus is able to utilize advantages conveyed by indium tin oxide such as transparency and conductivity without being constrained by its brittleness. Where the brittleness of the indium tin oxide is a constraint such as where the substrate curves or can bend, a different conductor may be used in the conductive path.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. An apparatus comprising:
   a substrate comprising a first surface and a second surface, a first portion, and a different second portion, wherein the first portion is substantially flat and the second portion is substantially curved;
   a touch detection circuit comprising a plurality of traces disposed on the first portion of the first surface of the substrate; and
   at least one conductive path extending over the first surface of the substrate and within defining edges of the substrate and connected to at least part of the touch detection circuit, the at least one conductive path overlapping the first surface of the substrate and the plurality of traces of the touch detection circuit at portions of each of the plurality of traces and at portions of the substrate, and the at least one conductive path extending orthogonal to the plurality of traces, the at least one conductive path comprising a first portion of non-bendable conductor comprising a first conductive material having a direct serial connection to a second portion of a different conductor comprising a second conductive material different from the first conductive material, wherein the first portion of each conductive path extends over the first portion of the substrate and the second portion of each conductive path extends over the second portion of the substrate to form a line following the first surface of the substrate;

wherein the second portion of the different conductor is bendable and is curved so as to be under a compressive strain;

wherein a portion of the bendable second portion of the different conductor extends partially onto the first portion of the substrate;

wherein the first conductive material does not overlap the bendable and curved second portion of the different conductor; and wherein the first conductive material is indium tin oxide.

2. An apparatus as claimed in claim 1, wherein the bendable and curved second portion of the different conductor is copper, silver, or gold.

3. An apparatus as claimed in claim 1, wherein the second portion of each conductive path follows a curvature in the first surface of the substrate and is located at an interior surface of the curvature.

4. An apparatus as claimed in claim 1, wherein the first portion of the substrate is a rigid and flat.

5. An apparatus as claimed in claim 1, wherein the substrate comprises, in addition to the first portion and the different second portion, a third portion; and the at least one conductive path extending over the substrate comprises, in addition to the first portion of each conductive path and the second portion of each conductive path, a third portion of non-bendable conductor connected in electrical series to the second portion of each conductive path, wherein the first portion of each conductive path extends over the first portion of the substrate, the second portion of each conductive path extends over the second portion of the substrate and the third portion of each conductive path extends over the third portion of the substrate and wherein the third portion of each conductive path comprises the first conductive material different from the second conductive material and wherein the third portion of the substrate is substantially flat.

6. An apparatus as claimed in claim 1, wherein the at least one conductive path comprises multiple parallel portions forming the second portion of the conductive path.

7. An apparatus as claimed in claim 1, comprising multiple conductive paths extending in parallel over the first surface of the substrate, wherein some or all of the multiple conductive paths each comprise a first portion of non-bendable conductor connected in electrical series to a second portion of a different conductor.

8. An apparatus as claimed in claim 1, comprising a flexible film, wherein the at least one conductive path extending over the first surface of the substrate is positioned between the flexible film and the first surface of the substrate.

9. An apparatus as claimed in claim 8, wherein the flexible film is transparent.

10. An apparatus as claimed in claim 1, wherein the different conductor of the second portion of the conductive path is a flexible conductor.

11. An apparatus as claimed in claim 1, wherein the different conductor of the second portion of the conductive path is one or more of gold, copper or silver.

12. An apparatus as claimed in claim 1, wherein the substrate is transparent.

13. An apparatus as claimed in claim 1, wherein the substrate is a display screen.

14. An apparatus as claimed in claim 1, configured as a housing cover for a hand-portable electronic device.

15. A method comprising:
providing a substrate comprising a first surface and a second surface, a first portion, and a different second portion, wherein the first portion is substantially flat and the second portion is substantially curved;
providing a non-bendable conductor comprising a first conductive material on the first portion of the substrate as a first portion of a conductive path extending over the first portion of the substrate;
providing a touch detection circuit comprising a plurality of traces disposed on the first portion of the first surface of the substrate; and
providing a different conductor comprising a second conductive material different from the first conductive material on the second portion of the substrate as a second portion of the conductive path extending over the first portion of the substrate;
wherein the conductive path extends within defining edges of the substrate and is connected to at least part of the touch detection circuit, the conductive path overlapping the first surface of the substrate and the plurality of traces of the touch detection circuit at portions of each of the plurality of traces and at portions of the substrate, and the conductive path extending orthogonal to the plurality of traces;
wherein the first portion of the conductive path and the second portion of the conductive path are connected to have a direct serial connection to form a line following the first surface of the substrate; and
wherein the second portion of the conductive path is bendable and is curved so as to be under a compressive strain;
wherein a portion of the bendable second portion of the conductive path extends partially onto the first portion of the substrate;
wherein the first conductive material does not overlap the bendable and curved second portion of the conductive path;
wherein the first conductive material is indium tin oxide.

16. A method as claimed in claim 15, wherein:
providing the non-bendable conductor on the first portion of the substrate as the first portion of the conductive path; and
providing the different conductor on the second portion of the substrate as the second portion of the conductive path comprises:
providing the non-bendable conductor on a film;
providing the different conductor on the film; and
laminating the film and the substrate.

17. A method as claimed in claim 16, wherein the film is a flexible film.

18. A method as claimed in claim 16, wherein the different conductor is a flexible conductor.

* * * * *